US011424193B2

(12) United States Patent
Ma et al.

(10) Patent No.: US 11,424,193 B2
(45) Date of Patent: Aug. 23, 2022

(54) SUBSTRATE OF A DISPLAY PANEL WITH ALIGNMENT MARKS, AND A METHOD OF MAKING THE SAME

(71) Applicants: Hefei Xinsheng Optoelectronics Technology Co., Ltd., Hefei (CN); BOE Technology Group Co., Ltd., Beijing (CN)

(72) Inventors: Tao Ma, Beijing (CN); Chao Jiao, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 303 days.

(21) Appl. No.: 16/605,494

(22) PCT Filed: Apr. 10, 2019

(86) PCT No.: PCT/CN2019/082078
§ 371 (c)(1),
(2) Date: Oct. 15, 2019

(87) PCT Pub. No.: WO2020/098210
PCT Pub. Date: May 22, 2020

(65) Prior Publication Data
US 2021/0366836 A1 Nov. 25, 2021

(30) Foreign Application Priority Data

Nov. 16, 2018 (CN) .......................... 201811366421.0

(51) Int. Cl.
H01L 23/544 (2006.01)
H01L 27/12 (2006.01)

(52) U.S. Cl.
CPC ........ *H01L 23/544* (2013.01); *H01L 27/1248* (2013.01); *H01L 27/1288* (2013.01); *H01L 2223/54426* (2013.01)

(58) Field of Classification Search
CPC ................... H01L 23/544; H01L 2223/54426
See application file for complete search history.

(56) References Cited

U.S. PATENT DOCUMENTS 6,589,852 B1    7/2003  Shih et al.
9,673,149 B2    6/2017  Wu et al.
                (Continued)

FOREIGN PATENT DOCUMENTS

CN    105206624 A  * 12/2015
CN    105206624 A    12/2015
                (Continued)

OTHER PUBLICATIONS

PCTCN2019082078-ISR.
CN2018113664210 first office action.

*Primary Examiner* — Selim U Ahmed
*Assistant Examiner* — Evan G Clinton
(74) *Attorney, Agent, or Firm* — IPro, PLLC

(57) ABSTRACT

Disclosed herein is a substrate of a display panel, comprising: a support; a first alignment mark on the support; a first dielectric layer covering the first alignment mark; an auxiliary alignment mark aligned with the first alignment mark, wherein the auxiliary alignment mark comprises a recess into the first dielectric layer. Further disclosed herein is a display panel comprising the substrate, and a system comprising the display panel. Also disclosed herein is a method comprising: forming a first alignment mark on a support; forming a first dielectric layer covering the first alignment mark; and forming an auxiliary alignment mark aligned with (Continued)

the first alignment mark; wherein the auxiliary alignment mark comprises a recess into the first dielectric layer.

20 Claims, 5 Drawing Sheets

(56) References Cited

U.S. PATENT DOCUMENTS

| | | | |
|---|---|---|---|
| 9,897,876 B2 | 2/2018 | Wang et al. | |
| 2007/0273803 A1* | 11/2007 | Liou | G02F 1/136227 |
| | | | 349/43 |
| 2012/0193626 A1 | 8/2012 | Wu et al. | |
| 2015/0200304 A1 | 7/2015 | Kim et al. | |
| 2016/0204070 A1* | 7/2016 | Wu | H01L 29/7869 |
| | | | 257/43 |
| 2017/0090227 A1* | 3/2017 | Yun | G02F 1/136286 |
| 2017/0192320 A1 | 7/2017 | Wang et al. | |
| 2017/0263564 A1 | 9/2017 | Kim et al. | |

FOREIGN PATENT DOCUMENTS

| | | |
|---|---|---|
| CN | 105446039 A | 3/2016 |
| CN | 105845555 A | 8/2016 |
| CN | 105845710 A | 8/2016 |
| CN | 105990094 A | 10/2016 |

\* cited by examiner

SUBSTRATE OF A DISPLAY PANEL WITH ALIGNMENT MARKS, AND A METHOD OF MAKING THE SAME

TECHNICAL FIELD

The disclosure herein relates to the field of display technology, and more particularly to a substrate of a display panel, a method of making the substrate, and the display panel comprising the substrate.

BACKGROUND

Conventional methods of preparing a display panel include the operations of exposing, developing and the like using a mask. In such a manner, the mask needs to be precisely aligned with the substrate of the display panel, so as to produce the various film layers needed for the final product.

SUMMARY

Disclosed herein is a substrate of a display panel, comprising: a support; a first alignment mark on the support; a first dielectric layer covering the first alignment mark; an auxiliary alignment mark aligned with the first alignment mark, wherein the auxiliary alignment mark comprises a recess into the first dielectric layer.

According to an embodiment, the first alignment mark comprises a first portion and a second portion separate from the first portion; wherein the auxiliary alignment mark is between the first portion and the second portion.

According to an embodiment, the recess is through an entire thickness of the first dielectric layer.

According to an embodiment, the substrate further comprises a second dielectric layer on the first dielectric layer; wherein the second dielectric layer comprises an opening encompassing the auxiliary alignment mark.

According to an embodiment, the opening is larger than the recess.

According to an embodiment, the opening encompasses the first alignment mark.

According to an embodiment, the substrate further comprises an electrically conductive layer covering the recess.

According to an embodiment, the substrate further comprises a second alignment mark on the first dielectric layer.

According to an embodiment, the second alignment mark is not joined with the recess.

According to an embodiment, the second alignment mark comprises an electrically conductive material.

According to an embodiment, the substrate further comprises a thin-film transistor (TFT); wherein the first alignment mark and a gate electrode of the TFT consist of the same material.

According to an embodiment, the substrate further comprises a thin-film transistor (TFT); wherein the first dielectric layer comprises a gate insulating layer of the TFT.

According to an embodiment, the first dielectric layer further comprises a passivation layer configured to passivate the gate insulating layer.

According to an embodiment, the recess is through the passivation layer.

Disclosed herein is a display panel, comprising any of the above substrates.

Disclosed herein is a system comprising the display panel above, wherein the system is an e-book reader, a laptop computer, a computer monitor, an OLED panel, a mobile phone, a tablet computer, a television, a display screen, a digital photo frame, or a portable GPS system.

Disclosed herein is a method comprising: forming a first alignment mark on a support; forming a first dielectric layer covering the first alignment mark; and forming an auxiliary alignment mark aligned with the first alignment mark; wherein the auxiliary alignment mark comprises a recess into the first dielectric layer.

According to an embodiment, forming the auxiliary alignment mark comprises patterning and etching the first dielectric layer.

According to an embodiment, the first alignment mark comprises a first portion and a second portion separate from the first portion; wherein the auxiliary alignment mark is between the first portion and the second portion.

According to an embodiment, the recess is through an entire thickness of the first dielectric layer.

According to an embodiment, the method further comprises forming a second dielectric layer on the first dielectric layer; wherein the second dielectric layer comprises an opening encompassing the auxiliary alignment mark.

According to an embodiment, the opening is larger than the recess.

According to an embodiment, the opening encompasses the first alignment mark.

According to an embodiment, forming the second dielectric layer comprises using a half-tone mask.

According to an embodiment, the method further comprises forming an electrically conductive layer covering the recess.

According to an embodiment, the method further comprises forming a second alignment mark on the first dielectric layer.

According to an embodiment, the second alignment mark is not joined with the recess.

According to an embodiment, the method further comprises forming a thin-film transistor (TFT) on the support; wherein the first alignment mark and a gate electrode of the TFT are formed by depositing the same material and at the same time.

According to an embodiment, the method further comprises forming a thin-film transistor (TFT) on the support; wherein the first dielectric layer comprises a gate insulating layer of the TFT and a passivation layer configured to passivate the gate insulating layer.

According to an embodiment, the recess is through the passivation layer.

DETAILED DESCRIPTION

Exemplary embodiments will now be described more fully with reference to the accompanying drawings.

At present, the patterning process employs alignment marks to fabricate a required pattern. However, the step height difference in an alignment mark area tends to affect the alignment marks used for the subsequent film layers. This further affects the alignment of the subsequent film layers, thus reducing the product quality.

Figure 1:
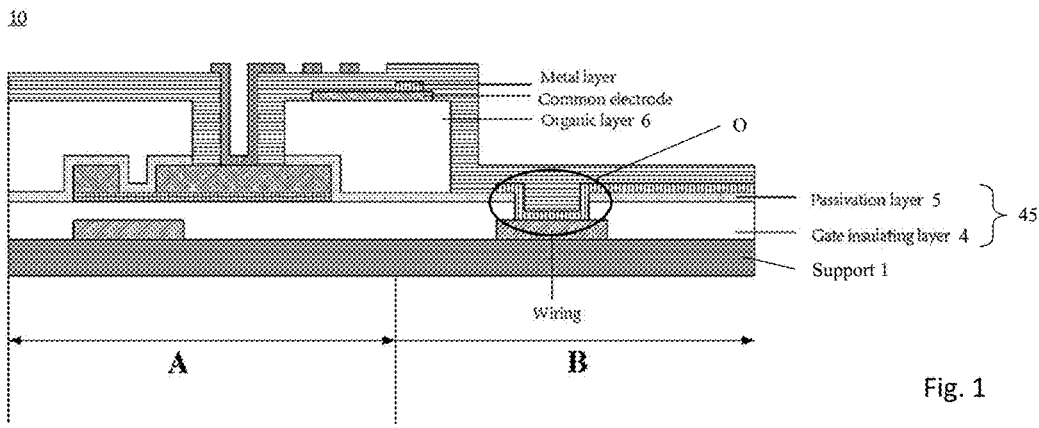
FIG. 1 is a cross-sectional view of a display panel.

Specifically, FIG. 1 shows a cross-sectional view of a substrate 10 of a display panel. As shown in FIG. 1, the substrate 10 comprises a display area A and a peripheral area B surrounding the display area A. The peripheral area B comprises a wiring area and an alignment mark area. For clarity, FIG. 1 only shows the cross-sectional structure of the wiring area of the peripheral area B, while the specific structure of the alignment mark area B1 is shown in FIG. 2.

Figure 2:
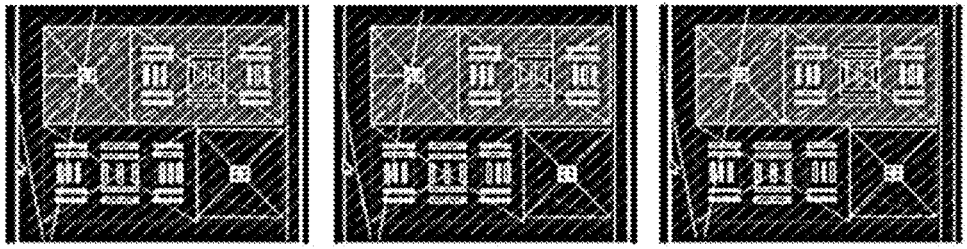
FIG. 2 is a planar diagram of a part of alignment marks in an alignment mark area.
Figure 2:
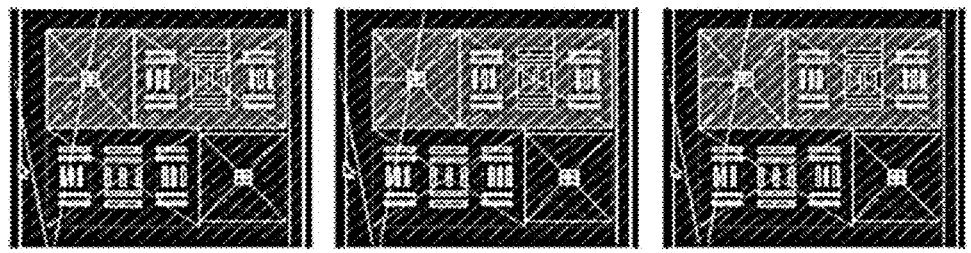

FIG. 2 shows a planar diagram of a part of the alignment marks in the alignment mark area. As shown in FIG. 2, the first alignment mark area for the alignment mark of a passivation layer in FIG. 1 is joined with the second alignment mark area for the alignment mark of a common electrode and a metal layer of the display area A in FIG. 1.

Figure 3:
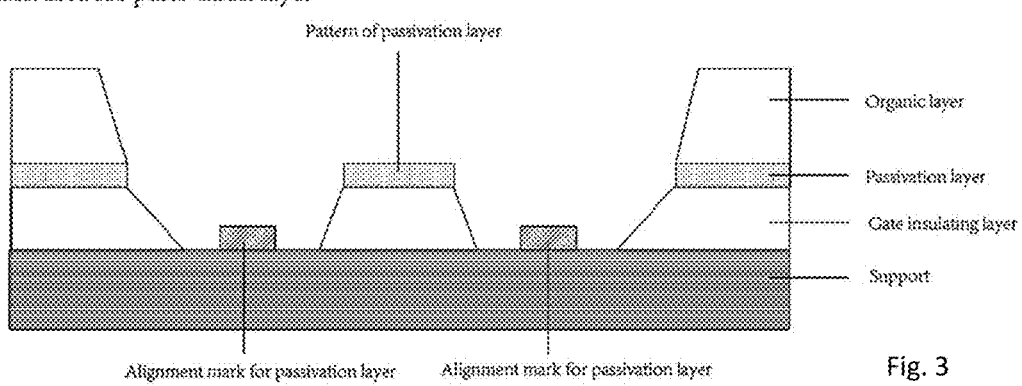
FIG. 3 is a cross-sectional view of a part of alignment marks in an alignment mark area.

FIG. 3 is a cross-sectional view of the first alignment mark area for the alignment mark of the passivation layer in FIG. 1. As shown in FIG. 1, in the display area A, when an opening is formed in the passivation layer, a mask is used to expose the passivation layer. As shown in FIG. 3, to precisely align the mask with the substrate to obtain an accurate film pattern, the alignment mark on the mask needs to be aligned precisely with the alignment mark on the passivation layer of the substrate. After the subsequent processing steps such as exposure and development, the passivation layer pattern corresponding to the alignment mark on the mask will be left in the alignment mark area of the passivation layer.

Further, referring to FIG. 1, to expose the wirings in the peripheral area B, the gate insulation layer below the passivation layer may be etched. In the alignment mark area of the passivation layer, after the passivation layer is patterned, the exposed gate insulator layer is also etched away. The alignment mark of the passivation layer is so formed.

Figure 4:
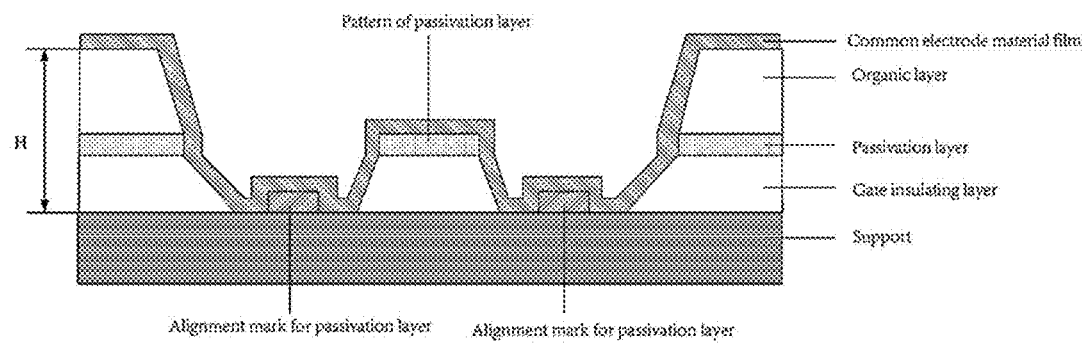
FIG. 4 is another cross-sectional view of a part of alignment marks in an alignment mark area.

Referring to FIG. 1, after the organic layer is formed, a common electrode in the display area A is formed. For example, the material of the common electrode can be indium tin oxide (ITO). A common electrode material film is formed in the alignment mark area of the passivation layer, as shown in FIG. 4. The common electrode material film refers to the film deposited concurrently with the common electrode and having the same material as the common electrode.

Referring to FIG. 4, due to a large step height difference (the height H from the top surface of the organic layer to the bottom surface of the opening that exposes the alignment mark of the passivation layer), in the process of patterning the common electrode material film, the photoresist formed on the common electrode material film in the opening is relatively thick. As a result, a part of the common electrode material film is not etched away, and a quasi-circular residue of the common electrode material film is left behind, as shown in FIG. 5.

Figure 5:
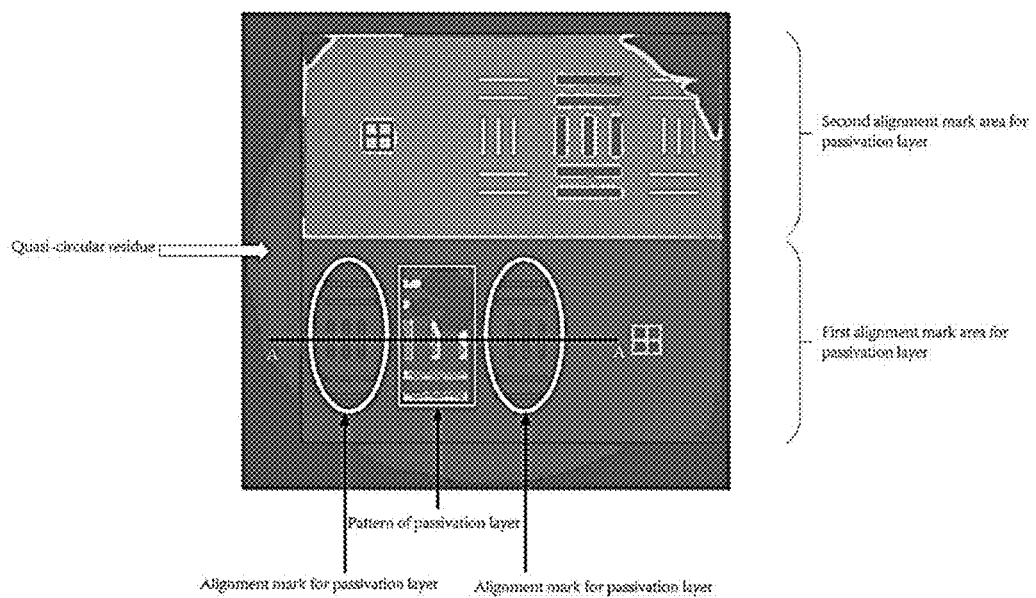
FIG. 5 is another planar diagram of a part of alignment marks in an alignment mark area.

FIG. 5 is a planar diagram corresponding to the cross-section of FIG. 4. Specifically, FIG. 4 is a cross-sectional view taken along line A-A in FIG. 5. In FIG. 5, the alignment mark area of the passivation layer comprises a first alignment mark area of the passivation layer and a second alignment mark area of the passivation layer. The first alignment mark area of the passivation layer is normally used in fabrication. The second alignment mark area of the passivation layer comprises a backup of the alignment mark of the passivation layer, which may be used when the alignment mark of the passivation layer in the first alignment mark area is defective.

As shown in FIG. 2, because the alignment mark area of the passivation layer is joined with the alignment mark area of the common electrode and the metal layer, the quasi-circular residue of the common electrode material film in FIG. 5 may affect the alignment mark area of the common electrode and the metal layer. This will further affect the subsequent alignment of the mask and the substrate in the process of patterning the metal layer.

The disclosure provides a substrate of a display panel, which can reduce the subsequent misalignment caused by the damage of the alignment marks in previously formed layers. Specifically, the substrate of the display panel of the disclosure can reduce the misalignment of the metal layer caused by the residue of the common electrode material in the alignment mark area of the passivation layer.

Figure 6:
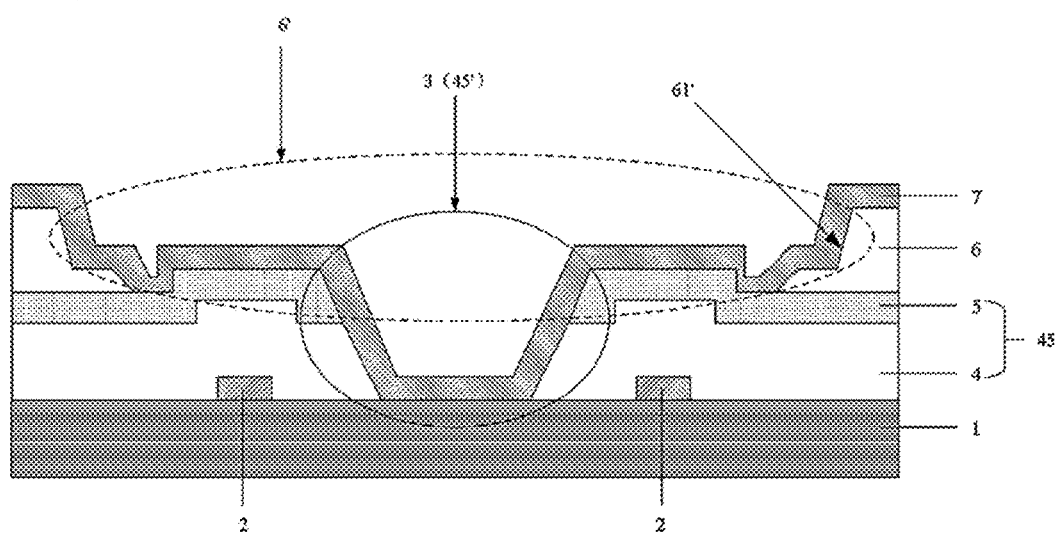
FIG. 6 is a cross-sectional view of a first alignment mark area according to an embodiment.
Figure 7:
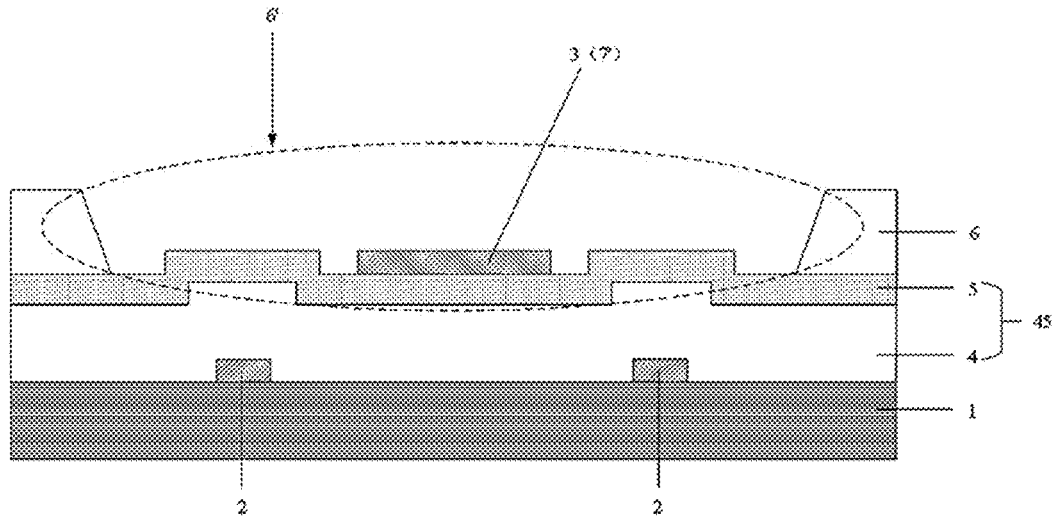
FIG. 7 is a cross-sectional view of a second alignment mark area according to an embodiment.

FIGS. 6-7 show the cross-sectional structure of a part of the alignment mark area. Specifically, FIG. 6 shows the cross-sectional structure of the first alignment mark area for patterning the first dielectric layer 45 in FIG. 1. FIG. 7 shows the cross-sectional structure of the second alignment mark area patterning the common electrode and the metal layer in FIG. 1. In the process of fabricating the substrate, each layer can cover the entire support 1. That is, each layer can cover both the display area and the peripheral area (including alignment mark area).

In FIGS. 6-7, the substrate 10 comprises: an alignment mark 2 on the support 1 in the first and second alignment mark areas, an auxiliary alignment mark 3 on the support 1 in the first and second alignment mark areas and between the alignment marks 2, and a first dielectric layer 45 covering the support 1 and the alignment mark 2.

According to an embodiment of the disclosure, the substrate 10 of the display panel further comprises a second dielectric layer 6 on the first dielectric layer 45 in the first and second alignment mark areas; the second dielectric layer 6 comprises a first opening 6' configured to expose the first dielectric layer 45. The orthographic projection of the bottom of the first opening 6' on the support 1 covers the orthographic projection of the auxiliary alignment mark 3 on the support 1.

According to an embodiment of the disclosure, in FIG. 6, the auxiliary alignment mark 3 aligned with the first alignment mark comprises a recess 45' into the first dielectric layer 45.

According to an embodiment of the disclosure, in FIG. 6, the substrate 10 further comprises a first electrically conductive layer 7 covering the recess 45', the first dielectric layer 45 and the second dielectric layer 6 in the first alignment mark area.

According to an embodiment of the disclosure, the alignment is between the first electrically conductive layer 7 and the common electrode in the display area A in FIG. 1. The common electrode thus has alignment marks for the first electrically conductive layer. Of course, these alignment marks are in the same layer as the common electrode.

According to an embodiment of the disclosure, materials for common electrodes include indium tin oxide.

In FIG. 6, the orthographic projection of the bottom of the first opening 6' on the support 1 covers the orthographic projection of the recess 45' on the support 1.

According to an embodiment of the disclosure, the first opening 6' in FIG. 6 has a stepped sidewall. The stepped sidewall can reduce the step height difference, thus reducing the residue of the common electrode materials, and eliminating the influence on the alignment of subsequent film layers.

According to an embodiment of the disclosure, to reduce the step height difference, the second dielectric layer in the entire alignment mark area is provided with an opening adapted to expose the alignment marks, thus avoiding the residue of the common electrode material.

According to an embodiment of the disclosure, in FIG. 7, the auxiliary alignment mark 3 in the second alignment mark area comprises a bump 7' on the first dielectric layer 45. In certain embodiments of the disclosure, the bump 7' in FIG. 7 is in the same layer as the common electrode in FIG. 1.

In FIG. 7, the orthographic projection of the bottom of the first opening 6' on the support 1 covers the orthographic projection of the bump 7' on the support 1.

The auxiliary alignment marks 3 in FIG. 6 and FIG. 7 are the patterns left on the substrate by the alignment marks on the corresponding mask in the process of patterning a corresponding film. Specifically, the recess 45' in FIG. 6 is the pattern left on the substrate by the alignment mark on the corresponding mask in the process of patterning the first dielectric layer 45. The bump 7' in FIG. 7 is the pattern left on the substrate by the alignment mark on the corresponding mask in the process of patterning the first electrically conductive layer 7.

Figure 8:
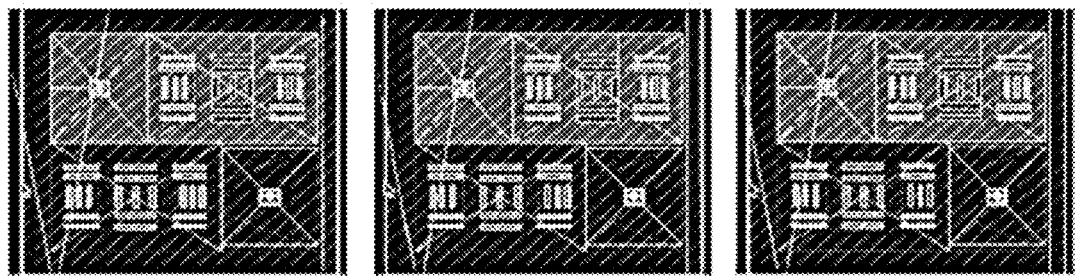
FIG. 8 is a planar diagram of a part of alignment marks in an alignment mark area according to an embodiment.
Figure 8:
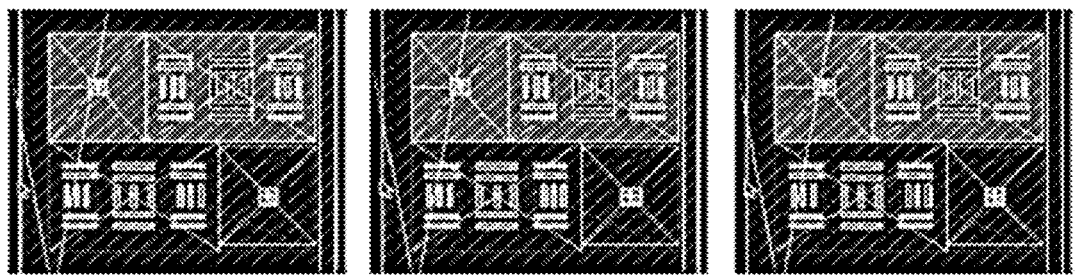

FIG. 8 is a planar diagram of part of alignment marks in the alignment mark area B1'. In certain embodiments of the disclosure, the bump 7' is not joined with the recess 45'. Furthermore, as shown in FIG. 8, the first alignment mark area for the alignment mark of the first dielectric layer 45 in FIG. 1 is not joined with the second alignment mark area for the alignment mark of the common electrode and the metal layer in FIG. 1. As a result, in the case of common electrode material residues occurring in the first alignment area, the second alignment mark area will not be affected, so as to obtain a high-quality alignment pattern.

According to an embodiment of the disclosure, the alignment marks 2 in FIG. 6 and FIG. 7 are in the same layer as the gate electrode of the thin-film transistor in the display area A in FIG. 1.

According to an embodiment of the disclosure, the first dielectric layer 45 comprises a gate insulating layer 4 and a passivation layer 5 on the gate insulating layer 4.

According to an embodiment of the disclosure, the first alignment mark area comprises an alignment mark for the passivation layer, and the second alignment mark area comprises an alignment mark for the common electrode and the metal layer.

The disclosure also provides a display panel comprising the aforesaid substrate 10 that can reduce the subsequent misalignment caused by the damage of the previous alignment mark.

Figure 9:
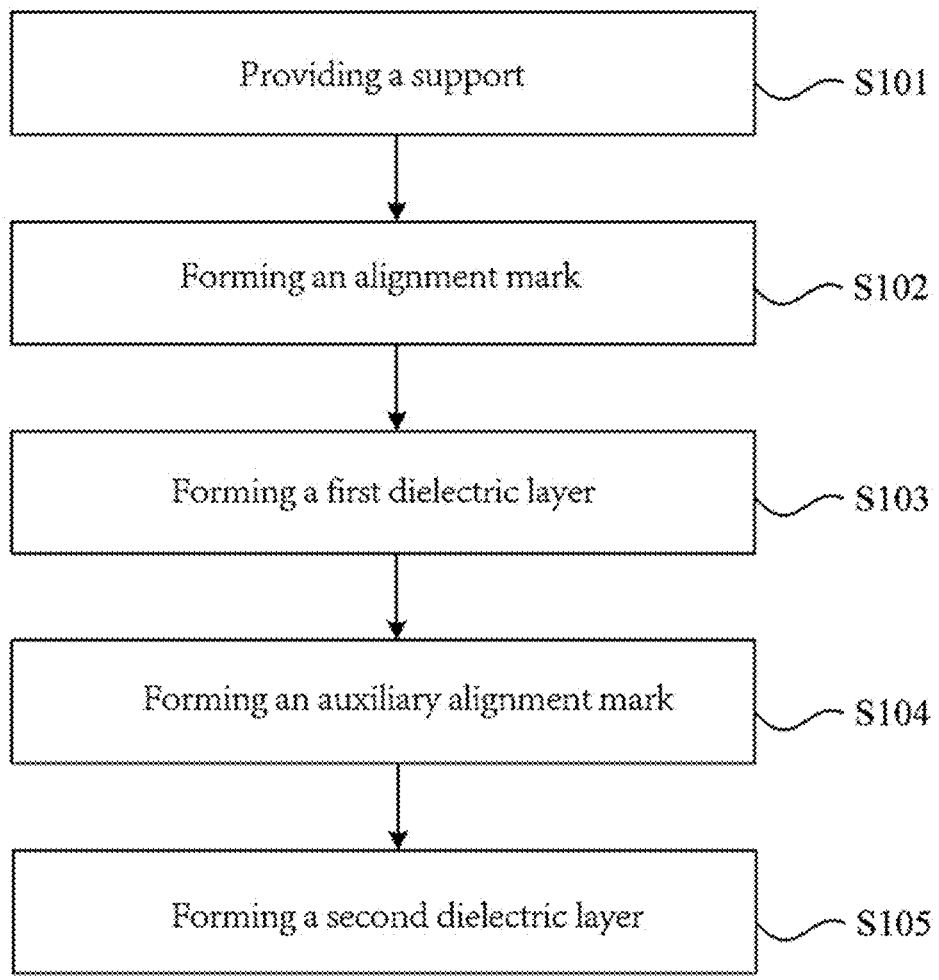
FIG. 9 is a flow chart of a method of making a substrate of a display panel according to an embodiment.

According to an embodiment of the disclosure, also provided is a method of preparing a substrate of a display panel. FIG. 9 is a flow chart of the method of preparing a substrate of a display panel according to an embodiment of the disclosure.

Referring to FIGS. 1, 6-7 and FIG. 9, the method is as shown in following S101-S104.

In S101, providing a support 1. The support 1 comprises a display area A and a peripheral area B encompassing the display area A. The peripheral area B comprises at least one alignment mark area (i.e., the first alignment mark area in FIG. 6 and the second alignment mark area in FIG. 7).

As shown in FIGS. 6 and 7, in S102, forming an alignment mark 2 on the support 1 in the first and second alignment mark area. In S103, forming a first dielectric layer 45 covering the support 1 and the alignment mark 2. In S104, forming an auxiliary alignment mark 3 on the support 1 in the first and second alignment mark area and between the alignment mark 2.

In certain embodiments of the disclosure, for example, in the first alignment mark area in FIG. 6, the auxiliary alignment mark 3 comprises a recess 45' into the first dielectric layer 45. In the second alignment mark area in FIG. 7, the auxiliary alignment mark 3 comprises a bump 7' on the first dielectric layer 45.

In certain embodiments of the disclosure, referring to FIG. 6, forming the recess 45' comprises: following the formation of the first dielectric layer 45, pattering the first dielectric layer 45 to form the recess 45' in the first dielectric layer 45.

In certain embodiments of the disclosure, referring to FIGS. 6-7, the method further comprises S105: forming a second dielectric layer 6 on the first dielectric layer 45 in the first and second alignment mark areas, and S106: patterning the second dielectric layer 6 to form a first opening 6' on the second dielectric layer 6 configure to expose the first dielectric layer 45. The orthographic projection of the bottom of the first opening 6' on the support 1 covers the orthographic projection of the auxiliary alignment mark 3 on the support 1.

In certain embodiments of the disclosure, in the first alignment mark areas shown in FIG. 6, the first opening 6' has a stepped sidewall. The second dielectric layer 6 is formed using a half-tone mask to form the first opening 6' with a stepped sidewall.

In certain embodiments of the disclosure, referring to FIG. 6, the method further comprises forming a first electrically conductive layer 7 covering the recess 45', the first dielectric layer 45 and the second dielectric layer 6.

In certain embodiments of the disclosure, referring to the second alignment mark area in FIG. 7, the auxiliary alignment mark 3 comprises a bump 7' on the first dielectric layer 45.

In certain embodiments of the disclosure, forming the bump 7' comprises: patterning the first electrically conductive layer 7 to form the bump 7' and the common electrode in the display area.

In certain embodiments of the disclosure, the material of the common electrode comprises indium tin oxide (ITO).

In certain embodiments of the disclosure, the bump 7' in the second alignment mark area in FIG. 7 is not joined with the recess 45' in the first alignment mark area in FIG. 6. Furthermore, in FIG. 8, the first alignment mark area for the alignment mark of the first dielectric layer 45 in FIG. 1 is not joined with the second alignment mark area for the alignment mark of the common electrode and the metal layer in FIG. 1. As a result, in the case of ITO residues occurring in the first alignment area, the second alignment mark area will not be affected, so as to obtain a high-quality alignment pattern.

In certain embodiments of the disclosure, referring to FIGS. 1 and 6-7, forming the alignment mark 2 comprises: forming a second electrically conductive layer (not shown in the drawings) on the support 1; patterning the second electrically conductive layer to form a gate electrode of the thin-film transistor in the display area A and the alignment mark 2 in the alignment mark areas (that is, the first alignment mark area in FIG. 6 and the second alignment mark area in FIG. 7).

In certain embodiments of the disclosure, referring to FIGS. 1 and 6-7, forming the first dielectric layer 45 comprises: forming a gate insulating layer 4 covering the support 1 and the alignment mark 2, and forming a passivation layer 5 on the gate insulating layer 4.

In certain embodiments of the disclosure, referring to FIG. 1, forming the second electrically conductive layer comprises forming a first wiring in the peripheral area B. Referring to FIGS. 1 and 6, forming the first dielectric layer 45 further comprises forming a second opening O configured to exposing the first wiring.

It should be noted that, in certain embodiments of the disclosure, the first alignment mark area comprises alignment marks for the passivation layer, and the second alignment mark area comprises alignment marks for the common electrode and the metal layer.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A substrate of a display panel, comprising:
a support;
a first alignment mark on the support;
a first dielectric layer covering the first alignment mark;
an auxiliary alignment mark aligned with the first alignment mark, wherein the auxiliary alignment mark comprises a recess into the first dielectric layer;
a second dielectric layer on the first dielectric layer;
wherein the second dielectric layer comprises an opening encompassing the auxiliary alignment mark;
wherein the opening encompasses the first alignment mark.

2. The substrate of claim 1, wherein the first alignment mark comprises a first portion and a second portion separate from the first portion; wherein the auxiliary alignment mark is between the first portion and the second portion.

3. The substrate of claim 1, wherein the recess is through an entire thickness of the first dielectric layer.

4. The substrate of claim 1, wherein the opening is larger than the recess.

5. The substrate of claim 1, further comprising an electrically conductive layer covering the recess.

6. The substrate of claim 1, further comprising a thin-film transistor (TFT); wherein the first alignment mark and a gate electrode of the TFT consist of the same material.

7. A display panel, comprising the substrate of claim 1.

8. A system comprising the display panel of claim 7, wherein the system is an e-book reader, a laptop computer, a computer monitor, an OLED panel, a mobile phone, a tablet computer, a television, a display screen, a digital photo frame, or a portable GPS system.

9. The substrate of claim 5, wherein the electrically conductive layer covers the first dielectric layer and the second dielectric layer.

10. The substrate of claim 1, wherein the opening has a stepped sidewall.

11. A method comprising:
forming a first alignment mark on a support;
forming a first dielectric layer covering the first alignment mark; and
forming an auxiliary alignment mark aligned with the first alignment mark;
forming a second dielectric layer on the first dielectric layer;
wherein the second dielectric layer comprises an opening encompassing the auxiliary alignment mark;
wherein the auxiliary alignment mark comprises a recess into the first dielectric layer;
wherein the opening encompasses the first alignment mark.

12. The method of claim 11, wherein forming the auxiliary alignment mark comprises patterning and etching the first dielectric layer.

13. The method of claim 11, wherein the first alignment mark comprises a first portion and a second portion separate from the first portion; wherein the auxiliary alignment mark is between the first portion and the second portion.

14. The method of claim 11, wherein the recess is through an entire thickness of the first dielectric layer.

15. The method of claim 11, wherein the opening is larger than the recess.

16. The method of claim 11, wherein forming the second dielectric layer comprises using a half-tone mask.

17. The method of claim 11, further comprising forming an electrically conductive layer covering the recess.

18. The method of claim 11, further comprising forming a thin-film transistor (TFT) on the support; wherein the first alignment mark and a gate electrode of the TFT are formed by depositing the same material and at the same time.

19. The method of claim 17, wherein the electrically conductive layer covers the first dielectric layer and the second dielectric layer.

20. The method of claim 11, wherein the opening has a stepped sidewall.

* * * * *